(12) United States Patent
Oh et al.

(10) Patent No.: US 11,200,925 B2
(45) Date of Patent: Dec. 14, 2021

(54) READ ONLY MEMORY (ROM)-EMULATED MEMORY (REM) PROFILE MODE OF MEMORY DEVICE

(71) Applicant: Micron Technology, Inc., Boise, ID (US)

(72) Inventors: Jonathan Wen Jian Oh, Boise, ID (US); Aaron James Olson, Boise, ID (US); Fulvio Rori, Boise, ID (US); Qisong Lin, El Dorado Hills, CA (US); Preston A. Thomson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/946,305

(22) Filed: Jun. 16, 2020

(65) Prior Publication Data
US 2021/0193199 A1 Jun. 24, 2021

Related U.S. Application Data

(60) Provisional application No. 62/952,782, filed on Dec. 23, 2019.

(51) Int. Cl.
*G11C 7/10* (2006.01)
*G06F 12/0882* (2016.01)
*G06F 9/30* (2018.01)
*G06F 11/27* (2006.01)

(52) U.S. Cl.
CPC ........ *G11C 7/1084* (2013.01); *G06F 9/30101* (2013.01); *G06F 9/30189* (2013.01); *G06F 11/27* (2013.01); *G06F 12/0882* (2013.01); *G11C 7/106* (2013.01); *G11C 7/1057* (2013.01); *G11C 7/1087* (2013.01)

(58) Field of Classification Search
CPC ... G11C 7/1084; G11C 7/1057; G11C 7/1087; G11C 7/106; G06F 9/30189; G06F 12/0882; G06F 11/27; G06F 9/30101
See application file for complete search history.

(56) References Cited

U.S. PATENT DOCUMENTS

| | | | |
|---|---|---|---|
| 6,438,664 B1 * | 8/2002 | McGrath | G06F 9/24 711/102 |
| 2009/0031103 A1 * | 1/2009 | Henry | G06F 9/24 712/16 |
| 2010/0195363 A1 * | 8/2010 | Norman | G11C 5/02 365/51 |

* cited by examiner

*Primary Examiner* — Ajay Ojha
(74) *Attorney, Agent, or Firm* — Lowenstein Sandler LLP

(57) ABSTRACT

A programmable memory device includes a read only memory (ROM) block to store instructions associated with functionality of the programmable memory device. The device includes a memory array having a set of reserved pages to store updates to be performed on the ROM block. The device includes a controller coupled to the ROM block and the memory array. The controller is to execute the instructions to: execute a set features command; program, in execution of the set features command, a set of sub-feature parameters to a specified feature address of the set of reserved pages, wherein the set of sub-feature parameters are to trigger operation within a ROM-emulated memory (REM) profile mode; and program a REM-profiled page of the set of reserved pages with REM data received from a host system.

21 Claims, 6 Drawing Sheets

READ ONLY MEMORY (ROM)-EMULATED MEMORY (REM) PROFILE MODE OF MEMORY DEVICE

RELATED APPLICATIONS

This application claims benefit under 35 U.S. C. § 119(e) of U.S. Provisional Patent Application No. 62/952,782, filed Dec. 23, 2019, which is incorporated herein by this reference in its entirety.

TECHNICAL FIELD

Embodiments of the disclosure relate generally to memory sub-systems, and more specifically, related to read only memory (ROM)-emulated memory (REM) profile mode of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
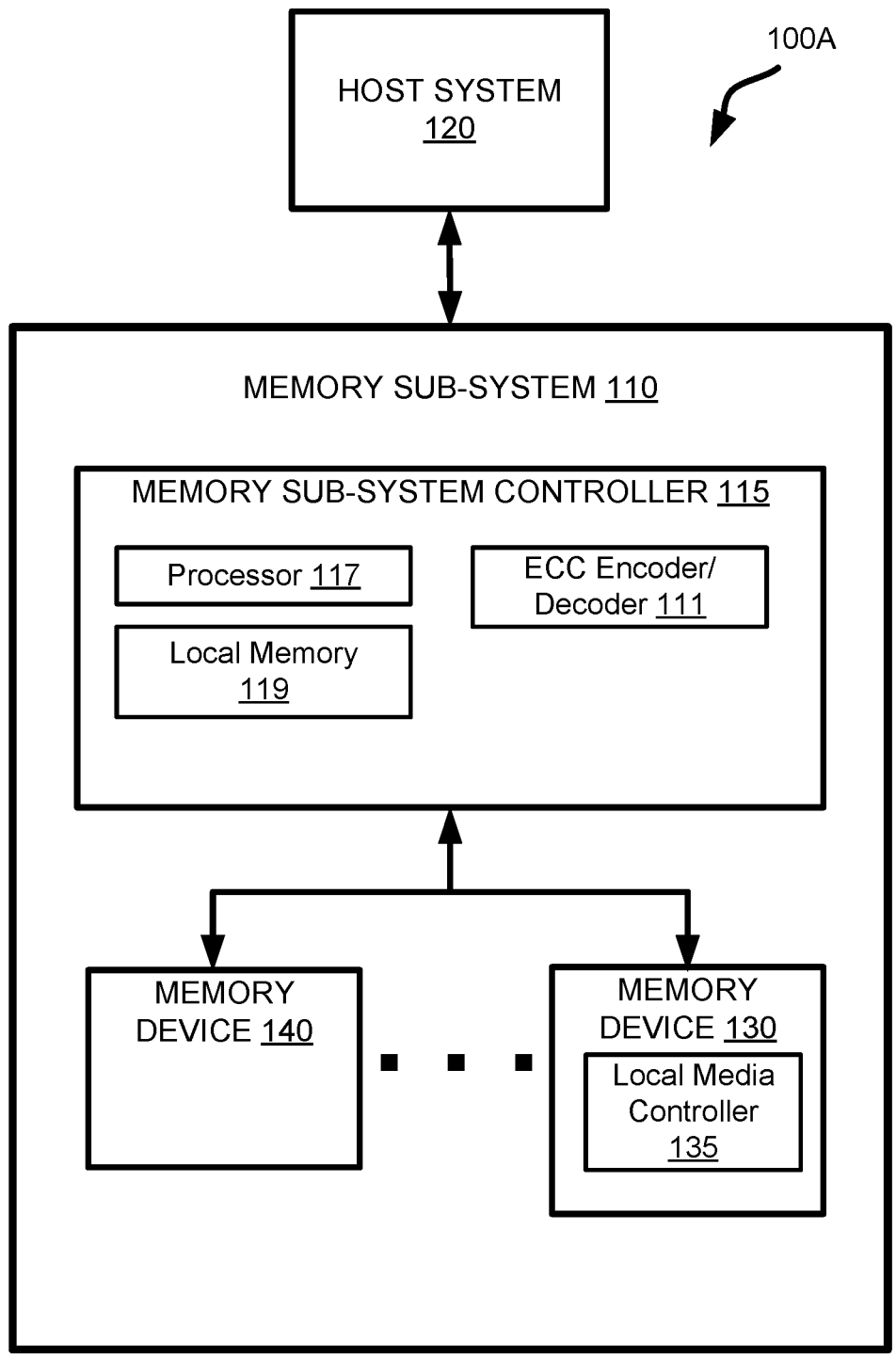
FIG. 1A illustrates an example computing system that includes a memory sub-system according to embodiments of the present disclosure.

Aspects of the present disclosure are directed to read only memory (ROM)-emulated memory (REM) profile mode of a memory device. A memory sub-system can be a storage device, a memory module, or a hybrid of a storage device and memory module. Examples of storage devices and memory modules are described below in conjunction with FIGS. 1A-1B. In general, a host system can utilize a memory sub-system that includes one or more memory components or devices. The host system can provide data to be stored at the memory sub-system and can request data to be retrieved from the memory sub-system.

The memory sub-system can include multiple memory components or memory devices that can store data from the host system, to include a programmable memory device. A memory device can include a ROM separate from programmable memory (e.g., memory array) of a memory device. The ROM stores instructions (e.g., microcode) for the programmable memory of the memory device. These instructions can be adapted to respond to commands (e.g., from a host system) and perform operations according to logic such as a state machine or the like. A ROM-emulated memory (REM) of a memory device is data that can be stored into reserved pages such as one-time programmable (OTP) pages of the memory array as a patch, e.g., an update to operation of the instructions stored in the ROM. In this way, although the ROM is read only, the operation of the ROM can be altered or fixed later on after the memory device has shipped to a customer. The REM data, for example, can be loaded from the OTP pages into a latches buffer and executed as a patch to the operation of the ROM instructions.

More specifically, the programmable memory (such as negative-AND type flash memory (NAND) or other programmable non-volatile memory array) in some embodiments includes a set of reserved pages stored in an OTP area of the programmable memory. The OTP area can be within a range of the reserved pages known to be available for permanent storage. In one embodiment, to operate in OTP operation mode, a user enables the OTP operation mode via issuance of a set features command to a specified feature address (e.g., 90h) and to write a parameter (e.g., 01h) to a first reserved page (P1) followed by three cycles of writing another parameter (e.g., 00h) to three additional reserved pages (e.g., P2, P3, P4). When the memory device is in OTP operation mode, subsequent PAGE READ (e.g., 00h-30h) and PROGRAM PAGE (e.g., 80h-10h) commands are applied to the OTP area of the programmable memory. In one embodiment, the parameters stored into OTP pages are to modify default power-on behavior and operation of the memory device.

In various embodiments, a vendor of the memory device may need to perform updates to the ROM either to fix operation of the ROM or to install a debug patch for diagnostic purposes, for example, after the memory device is in operation in the field. In various embodiments, the OTP operation mode can be altered to allow the user to directly (or the vendor to remotely) trigger operation within a REM profile mode in which the vendor can remotely send and install REM-based patches within designated reserved pages of the OTP area. To do so, the local media controller (e.g., control logic) of the programmable memory device can execute the set features command and program a set of sub-feature parameters to a specified feature address of the set of reserved pages that are to trigger operation within the REM profile mode. In one embodiment, the specified feature address is the same or similar to that used to enter OTP operation mode (e.g., for pages P1, P2, P3, and P4) while the sub-feature parameters are different from those used to enter OTP operation mode. In another embodiment, the specified feature address is different than that used to enter OTP operation mode while the sub-feature parameters are the same (or different) compared to those used to enter OTP operation mode. The processing device can then program a REM-profiled page of the set of reserved pages with REM data received from a host system, e.g., which received the REM data from the vendor.

In some embodiments, the processing device sets a flag stored in one of a reserved page or the REM-profiled page upon programming the REM-profiled page. The flag can be adapted to indicate whether the REM data (or REM code) is stored in the REM-profiled page, and thus is to be loaded for ROM operation. For example, after power up of the memory device, the processing device can detect that the flag is set, and then load the REM data (or code) from the REM-profiled page into a latches buffer to be executed as a modification to operation of the ROM instructions. In this way, operation within OTP operation mode and the REM profile mode can be distinguished, although the REM profile mode can be seen as a sub-mode and extension of the OTP operation mode (in also using OTP reserved pages).

Advantages of the present disclosure include but are not limited to making possible firmware updates to the ROM of the memory device, allowing in-field debugging (e.g., of diagnostic failures of the memory device), allowing system teams the ability to load and execute test modes of the memory device, and optionally providing access to certain test modes (and their results) by customers without the customers having access to the REM data itself. These advantages will be discussed in more detail. Other advantages will be apparent to those skilled in the art of power disable features of a memory sub-system discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components or devices, which can be an indirect communicative connection or direct communicative connection (e.g., without intervening components or devices), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells, e.g., one or more memory array each including programmable memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type and NAND are described, the memory device 130 can be based on any other type of non-volatile memory, such as read-only memory (ROM), phase change memory (PCM), self-selecting memory, other chalcogenide based memories, ferroelectric random access memory (Fe-RAM), magneto random access memory (MRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In some embodiments, the controller 115 includes an error-correcting code (ECC) encoder/decoder 111. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data.

Figure 1B:
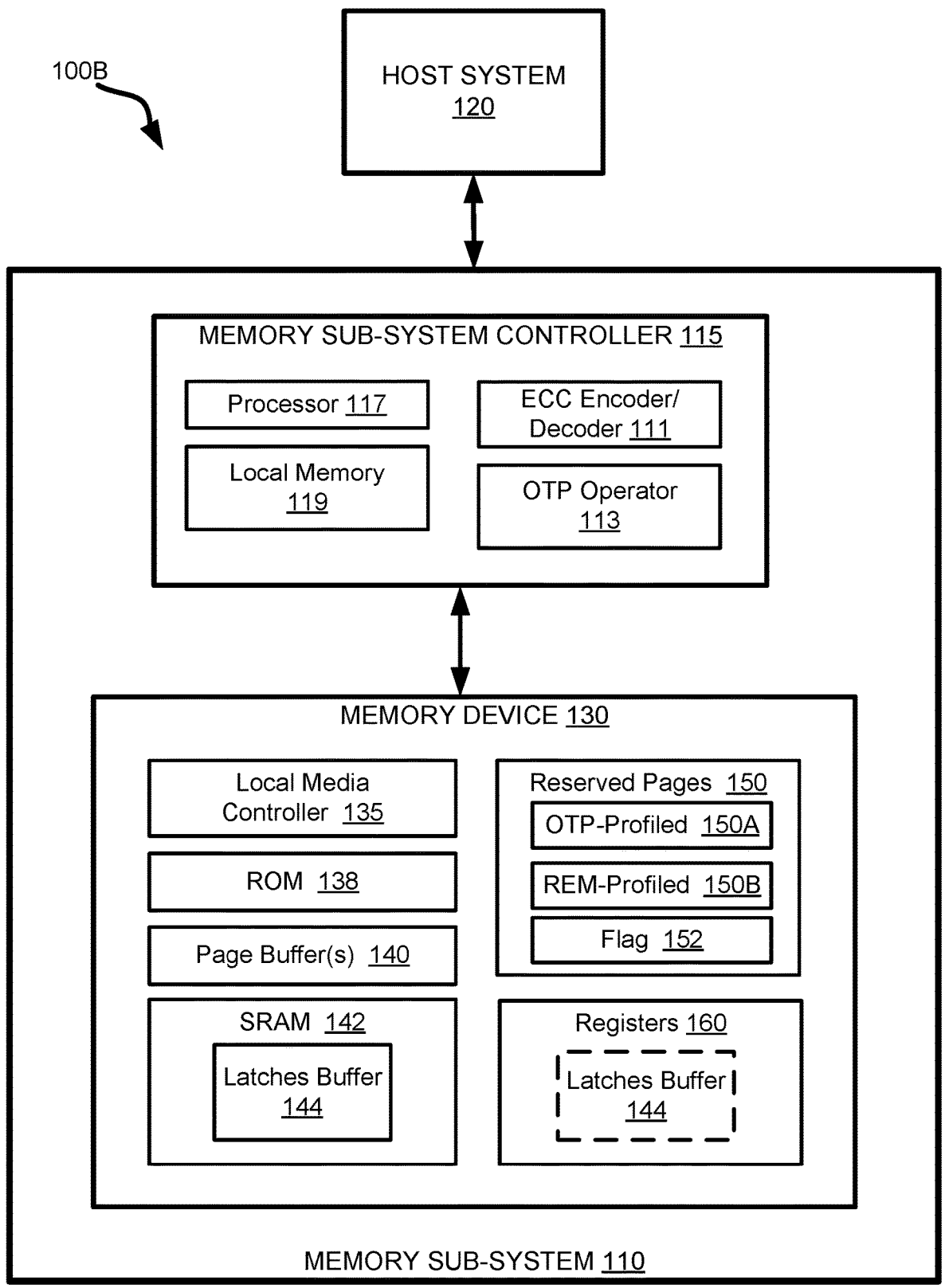
FIG. 1B illustrates a more detailed computing system that includes a programmable memory device adapted for operations within a REM profile mode according to various embodiments.

FIG. 1B illustrates a more detailed computing system 100B that includes a programmable memory device adapted for operations within a REM profile mode according to various embodiments. For example, the programmable memory device can be the memory device 130 discussed with reference to FIG. 1A. In some embodiments, the memory sub-system 110 includes an one-time programmable (OTP) operator 113 that is adapted to interface with the host system 120 to facilitate user (or remote) enabling of the OTP operation mode and the REM profile mode as described herein. In some embodiments, the OTP operator 113 can be part of the host system 120, the controller 115, or the memory device 130. For example, the controller 115 can include the processor 117 (e.g., processing device) configured to execute instructions stored in local memory 119 for performing the operations described herein.

In some embodiments, the controller 115 includes at least a portion of the OTP operator 113. Further, the controller 115 can include the processor 117 (e.g., processing device) configured to execute instructions stored in local memory 119 for performing the operations described herein. In some embodiments, the OTP operator 113 is part of the host system 120, an application, or an operating system.

In various embodiments, the memory device 130 (such as negative-AND type flash memory (NAND) or other programmable non-volatile memory device) includes the local media controller 135 (e.g., control logic), a read-only memory (ROM) 138, page buffer(s) 140, static random access memory (SRAM) 142, a set of reserved pages 150, and registers 160. In various embodiments, the SRAM 142 and/or the registers 160 provide a latches buffer 144. The set of reserved pages 150, which can be stored in a memory array, can include OTP-profiled pages 150A (e.g., in a first range of the reserved pages) and REM-profiled pages 150B (e.g., in a second range of the reserved pages). The pages within the set of reserved pages 150 can be set aside for OTP operations and be programmable once, without option of performing an erase operation or further programming once the pages have been programmed. As discussed, the REM profile mode can be viewed as a sub-mode to the OTP operation mode.

In some embodiments, the ROM 138 stores instructions (e.g., microcode) for the programmable memory of the memory device 130, and is associated with functionality of the memory device 130. These instructions can be adapted to respond to commands (e.g., from the host system 120) and perform operations according to logic such as a state machine or other code. Further, the page buffer(s) 140 can buffer data before the data is programmed into the ROM 138, This data can be received from the host system 120. This data can include, for example, the REM data or REM code, e.g., data that can be programmed into REM-profiled pages 150B as a patch or code that can be programmed into the REM-profiled pages 150B as debug firmware or a test mode program. For example, the REM data or code can be loaded (after power up of the memory device 130) into the latches buffer 144. The local media controller 135 (or control logic) of the memory device 130 can execute the REM data out of the latches buffer 144 as an update to operation of the instructions stored in the ROM 138 or execute the REM code out of the latches buffer 144 as debug firmware or a test mode program. In this way, although the ROM 138 is read only, the operation of the ROM can be altered or fixed later on after the memory device has shipped to a customer.

The REM data (or code), for example, can be loaded from the set of reserved pages 150 into the latches buffer 144 and executed as a patch (e.g., update or modification) to the operation of the ROM instructions. As a patch, when executed, the REM data redirects the state machine of the ROM 138 to an identified address in the latches buffer 144 (e.g., whether in the SRAM 142 or the one or more of the registers 160). The state machine can then reference the REM data loaded into the latches buffer 144 during execution. Until the power up sequence of the memory sub-system 110 completes, the REM data is not loaded and the memory device 130 operates just on the ROM firmware. In addition to the REM being automatically populated by the memory device 130, the REM data can be manually populated by the host system 120 (e.g., by a user of the host system 120) as well, as will be described in more detail.

In embodiments, the REM data (or code) functionally checks for when the processing device 130 tries to execute a particular command and replaces the command with a different action. The REM data/code can also enable engineers to swap or change the microcode of the memory device 130, which is helpful for quick prototyping, there is no need to wait for a design change to propagate a change to the microcode, and unique temporary behavior can be observed during specific tests. In various embodiments, REM data/code includes a REM word or several words, e.g., REM sequences. The REM sequences are to be stored together in the REM-profiled pages 150B so as to be executed together. Table 1 illustrates an example of how some custom REM data or code can be programmed in the REM-profiled pages 150B of the reserved pages 150.

TABLE 1

| Reserved Page | Programmed with: |
| --- | --- |
| Page_0 | Custom REM Data |
| Page_1 | Custom REM Code |
| Multiple Accessible Pages | Multiple custom REM data/code |
| ... | ... |
| Page_n | Custom REM Data |

In embodiments, each custom REM data or REM code can target a different usage. As just one example, bitline check test modes can be loaded as REM code and system firmware teams can execute this test mode to detect blocks of the memory device that are becoming harder to program. Once detected, the memory sub-system 110 can retire these blocks (e.g., groups of cells).

In various embodiments, the OTP area of the memory device 130 is within a range of the OTP-profiled pages 150A known to be available for permanent storage. Thus, customers (or users) can use the OTP area in any way desired, but typically is used to program serial numbers or to permanently store data (e.g., trim values) because the OTP area cannot be erased. In one embodiment, to operate in OTP operation mode, a user enables the OTP operation mode via issuance of a set features (EFh) command to a specified feature address (e.g., 90h) and to write a parameter (e.g., 01h) to a first reserved page (P1) followed by three cycles of writing another parameter (e.g., 00h) to three additional reserved pages (e.g., P2, P3, P4). These parameters can also be understood to be definitions or states to trigger a state machine of the ROM operation to enter into the OTP operation mode. When the memory device 130 is in OTP operation mode, subsequent PAGE READ (e.g., 00h-30h) and PROGRAM PAGE (e.g., 80h-10h) commands are applied to the OTP area of the programmable memory. Other ways of entering (and exiting) OTP operation mode are envisioned, including writing different parameters to different OTP pages.

In various embodiments, a vendor of the memory device may need to perform updates to the ROM 138 either to fix operation of the ROM (e.g., via a firmware update) or to install a debug patch for diagnostic purposes after the memory device 130 is in operation in the field. In various embodiments, the OTP operation mode is altered to allow a user to directly trigger entry into the REM profile mode (e.g., a user-selectable REM profile mode) via the host system 120 or to allow a vendor to remotely trigger entry into the REM profile mode (e.g., a remotely-selectable REM profile mode). In either case, the vendor can then remotely transfer (see FIG. 2) REM data (or code) to the host system 120, upon receipt of which, the memory sub-system 110 installs the REM data (or code) into the memory device 130, e.g., by way of the page buffers 140.

In some embodiments, in order to alter entry into OTP operation mode to operating within the REM profile mode, the local media controller 135 (e.g., control logic) of the programmable memory can execute the set features command and program a set of sub-feature parameters to a specified feature address of the set of reserved pages. In the embodiments, the sub-feature parameters are designed to trigger operation within the REM profile mode (as opposed to operation in the OTP operation mode). In one embodiment, the specified feature address is the same or similar to that used to enter the OTP operation mode (e.g., for pages P1, P2, P3, and P4) while the sub-feature parameters are different from those used to enter the OTP operation mode. In another embodiment, the specified feature address is different than that used to enter OTP operation mode while the sub-feature parameters are the same (or different) compared to those used to enter OTP operation mode. Once in the REM profile mode, the processing device can then program a REM-profiled page 150B of the set of reserved pages 150 with REM data received from a host system 120, e.g., which received the REM data (or code) from the vendor. To do so, a program counter of the instructions being executed in the ROM 138 may be shifted to point to the REM-profiled page 150B, e.g., as an address in the latches buffer to where the REM-profiled page 150B is copied.

In some embodiments, the processing device is further to set a flag 152 stored in one of a reserved page (of the set of reserved pages 150) or the REM-profiled page (where the REM data was programmed) upon programming the REM-profiled page. The flag 152 can be adapted to indicate whether the REM data (or code) is stored in the REM-profiled page, and thus is to be loaded for ROM operation. For example, after power up of the memory device, the processing device can detect that the flag 152 is set, and then load the REM data (or code) from the REM-profiled page into a latches buffer to be executed as a modification to operation of the ROM instructions. In this way, operation within OTP operation mode and the REM profile mode can be distinguished.

Figure 2:
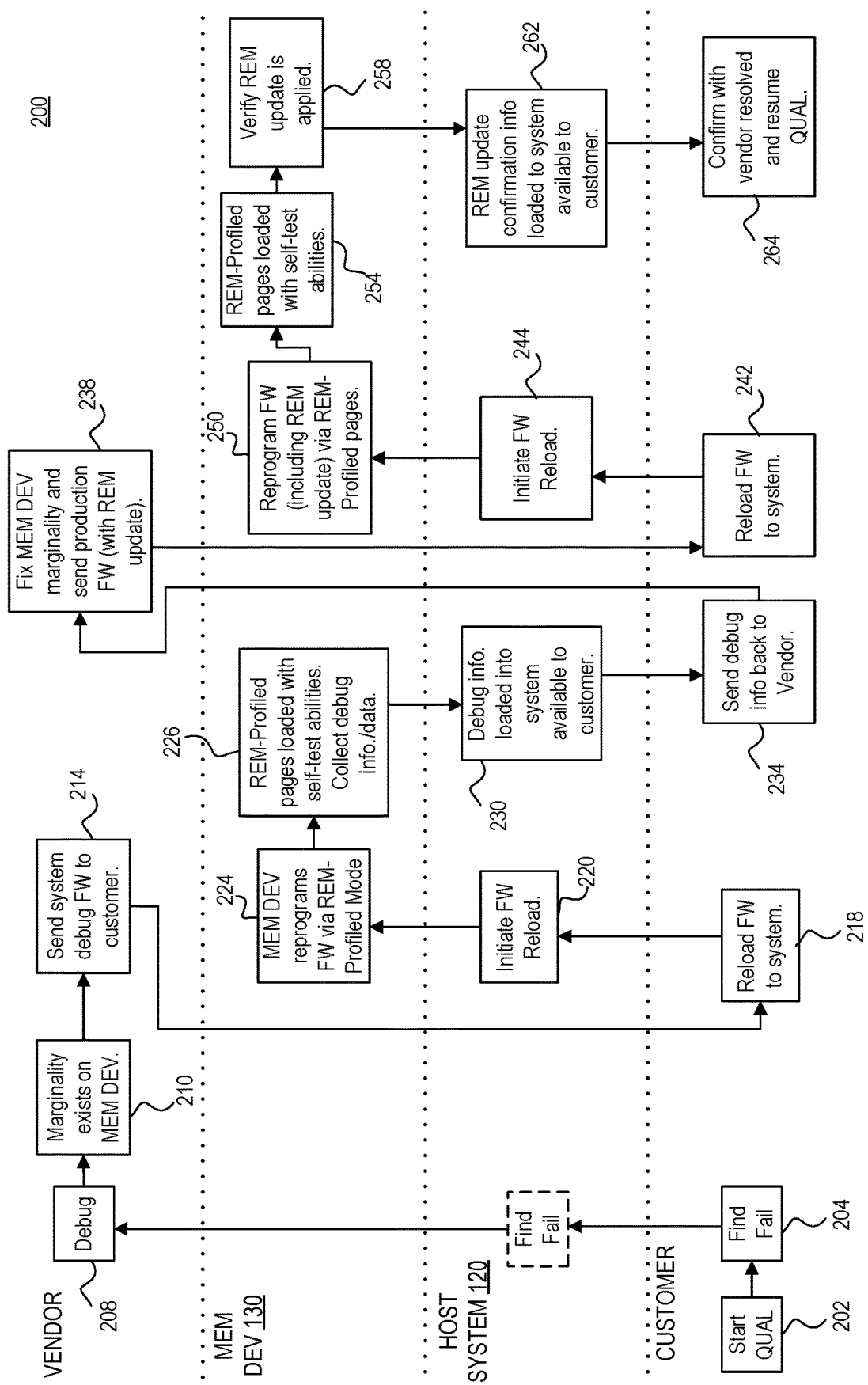
FIG. 2 is a flow chart of a method that illustrates a high-level interaction between a memory vendor, a memory device that employs a REM profile mode, installed system, and customer of the memory sub-system according to various embodiments.

FIG. 2 is a flow chart of a method 200 that illustrates a high-level interaction between a memory vendor, a memory device that employs a REM profile mode, installed system, and customer of the memory sub-system according to various embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by a vendor (e.g., assignee), the memory device 130, the host system 120, and a customer (or other user) with access to the host system 120 (see FIGS. 1A-1B). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 202, the customer (or user) starts a qualification test (QUAL), which is performed to verify the design and manufacturing process of the memory device 130 and can provide a baseline for subsequent acceptance tests. At operation 204, the customer finds or is informed of a failure (e.g., by the host system 120) in the qualification test, and sends a request with failure data related to the failure to the vendor to perform diagnosis or (e.g., debug) the failure of the memory device 130.

At operation 208, the vendor can undertake the diagnosis process (debug), based on the failure data. For example, at operation 210, the vendor can determine, based on analysis of the failure data, that marginality exists on the memory device 130. The vendor, at operation 214, can send a system debug firmware to the customer.

At operation 218, the customer can reload the system debug firmware via the host system 120. At operation 220, the host system 120 can initiate the reload of the system debug firmware. Here, the term "reload" is with reference to loading new REM code received from the vendor. In some embodiments, the vendor can remotely initiate the firmware reload without intercession by the customer.

At operation 224, the memory device 130 reprograms the firmware, e.g., the instructions or microcode executable by the ROM 138, with the REM code by entering into the REM-profiled mode as discussed earlier. While in the REM-profiled mode, at operation 226, the memory device 130 can load REM-profiled pages with self-test abilities. For example, REM code and associated test data can be programmed into the REM-profiled pages. Also at operation 226, the memory device 130 can collect debug information or data, and output the debug information data into the page buffer(s) 140 or the registers 160, e.g., to make it available to the host system.

At operation 230, the host system 120 can copy the debug information (or data), e.g., from the page buffer(s) 140 or registers 160, to an accessible interface (e.g., a graphical user interface or other output) of the host system 120. At operation 234, the customer can send the debug information (or data) to the vendor so that the vendor can develop a solution, which is often a patch to the firmware of the ROM 138. In some embodiments, operation 234 is skipped and the host system 120 automatically sends the debug information (or data) back to the vendor.

At operation 238, the vendor can develop a REM update to the production firmware, where the REM update includes REM data and/or code to operate as a patch solution to the marginality that exists on the memory device 130. The vendor can then send the REM data/code to the customer on the host system 120.

At operation 242, the customer can reload the firmware to the host system 120. This action can be as simple as initiating an executable received from the vendor (e.g., in an email or instant message) or copy all REM data/code to the memory device 130. At operation 244, the host system can in turn initiate the firmware reload. In one embodiment, the vendor can remotely initiate the firmware reload at the host system 120, thereby bypassing the customer.

At operation 250, the memory device 130 reprograms the firmware via the REM-profiled pages 150B, as discussed previously and that will be discussed in additional detail with reference to FIGS. 3-4. The REM update can be REM code with new functionality, like a special test operation, or can contain a patch that fixes a bug in the firmware of the ROM 138. In either case, a full set of REM code is loaded, e.g., the addresses within REM address space of the latches buffer 144 are to be populated with the firmware reload. As discussed, this reprogramming can include, at operation 254, programming the REM-profiled pages 150B with the REM update (data and/or code) and setting the flag 152 to indicate the REM-profiled pages have been programmed. In embodiments, the FW reload programs the REM-profiled pages 150B with self-test abilities, which includes the ability to output status or test data to the page buffer(s) 140 or registers 160 as debug data/info. At operation 258, the memory device 130 can verify the REM update has been applied to the firmware of the ROM 138, and thus that the marginality of the memory device 130 has been resolved.

At operation 262, the host system 120 can load a confirmation of the REM update to the interface of the host system 120 that is available to the customer or user. The customer can then view or receive the confirmation. At operation 264, the customer can confirm with the vendor that the failure is resolved and resume the qualification test (QUAL).

Figure 3:
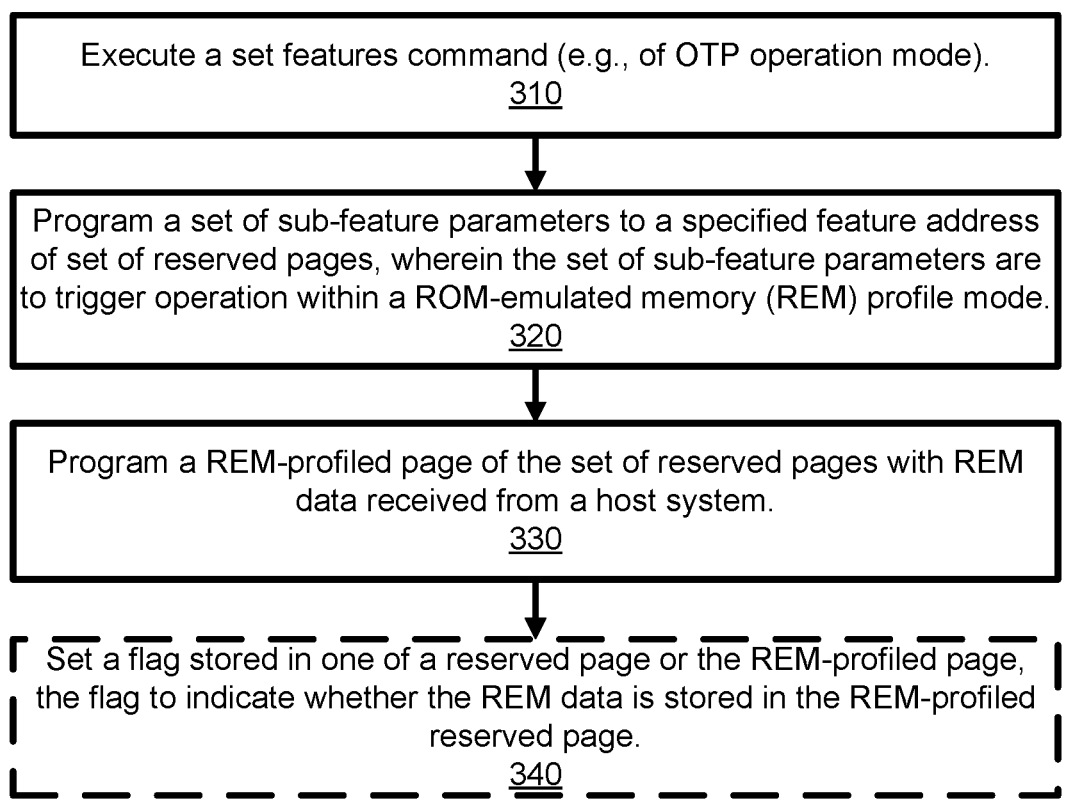
FIG. 3 is a flow chart of an example method for programming the memory sub-system for operation within the REM profile mode according to an embodiment.

FIG. 3 is a flow chart of an example method 300 for programming the memory sub-system for operation within the REM profile mode according to an embodiment. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the local media controller 135, e.g., control logic of the memory device 130. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic executes a set features command, which in one embodiment, is received from the OTP operator 113 and enables access to the set of reserved pages 150. For example, the set features command can be associated with the OTP operation mode and executed similarly, but can be directed to different OTP addresses and/or programmed with different sub-feature parameters.

At operation 320, the processing logic programs a set of sub-feature parameters to a specified feature address of a set of reserved pages. In one embodiment, the reserved pages are one time programmable (OTP) pages, e.g., the OTP-profiled pages 150A. The set of sub-feature parameters are to trigger operation within a ROM-emulated memory (REM) profile mode. The specified feature address may include an address to the first of a series of pages that are programmed with the sub-feature parameters that are REM-mode-specific parameters.

In one embodiment, to execute the set features command and program the set of sub-feature parameters to the specified feature address of the set of reserved pages, the processing logic is to execute the instructions (of the ROM 138) in response to user inputs received from the host system. This embodiment of the REM profile mode is a user-selectable REM profile mode.

In a another embodiment, to execute the set features command and program the set of sub-feature parameters to the specified feature address of the set of reserved pages, the processing logic is to execute the instructions (of the ROM 138) in response to a remote command received from a vendor via the host system 120. This embodiment of the REM profile mode is a remotely-selectable REM profile mode.

At operation 330, the processing logic programs a REM-profiled page 150B of the set of reserved pages 150 with REM data received from a host system 120. As discussed, this REM data can be patch or update to the firmware or microcode executed by the ROM 138. The REM data can further be or include REM code that is debug firmware or a test mode program that provides testing abilities. In one embodiment, the REM-profiled page can further include multiple REM-profiled pages corresponding to a set of different REM data or REM code.

At operation 340, the processing logic optionally sets a flag stored in one of a reserved page or the REM-profiled page. The flag 152 can indicate whether the REM data (or REM code) is stored in the REM-profiled page 150B. In other embodiments, although not illustrated, the flag is stored in one of the registers 160.

Figure 4:
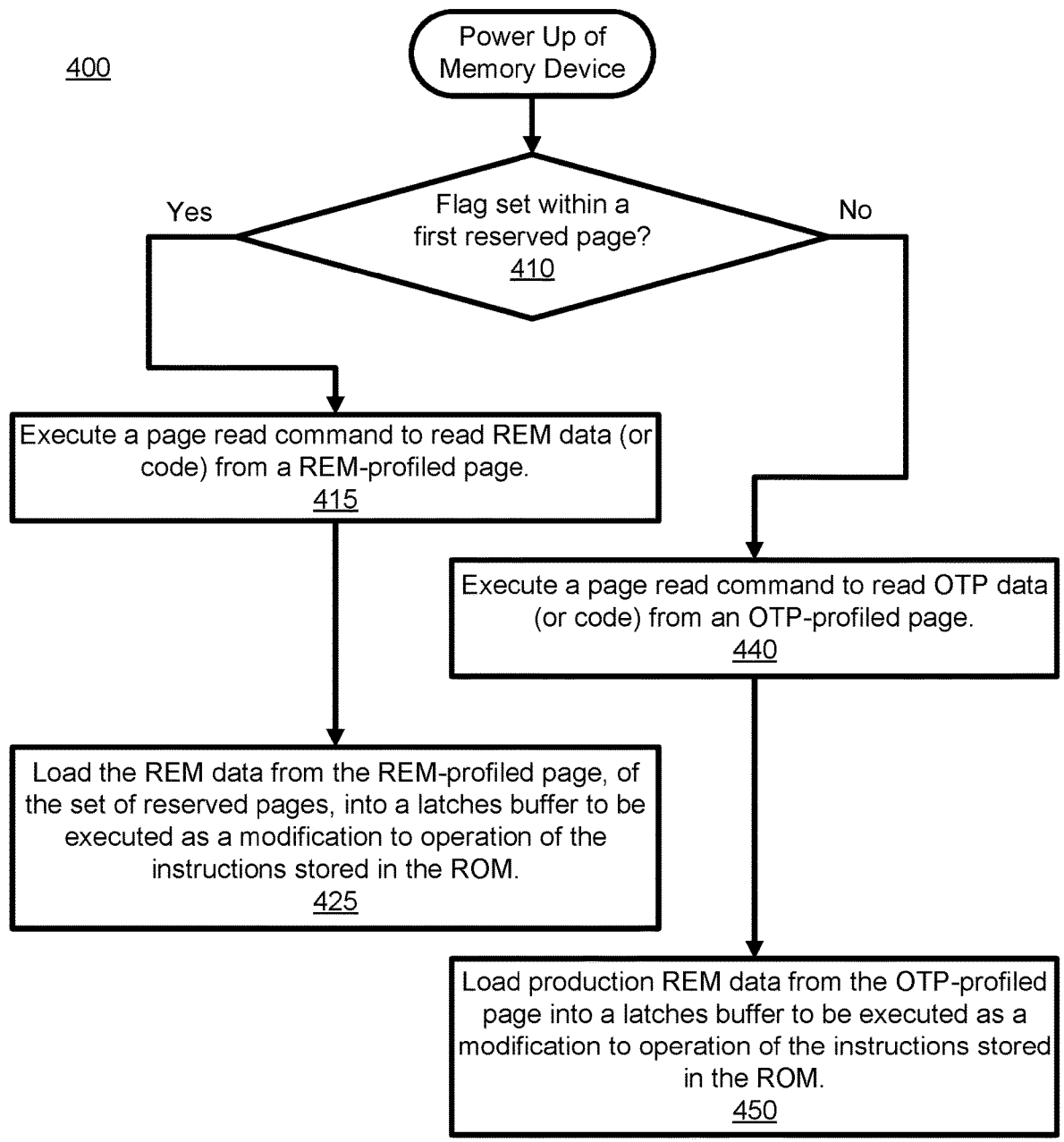
FIG. 4 is a flow chart of an example method for selection and operation within the REM profile mode after power up according to various embodiments.

FIG. 4 is a flow chart of an example method 400 for selection and operation within the REM profile mode after power up according to various embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the local media controller 135, e.g., control logic of the memory device 130. In one embodiment, a first reserved page of the set of reserved pages 150 stored a flag 152, although the flag 152 could also be stored in one of the registers 160 or other non-volatile memory. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 4, and after power up of the memory sub-system 110, at operation 410, the processing logic detects (e.g., determines) whether the flag 152 is set within the first reserved page (or in other non-volatile memory array). If the flag is set, this can be an indication that REM data (or REM code) stored in the set of reserved pages is associated with a REM profile mode. If the processing logic detects that the flag is set, at operation 415, the processing logic executes a read page command to read REM data (or code) from a REM-profiled page where it was stored (see FIG. 3.)

At operation 425, the processing logic loads the REM data (or REM code) from the REM-profiled page, of the set of reserved pages 150, into a latches buffer to be executed as a modification to operation of the instructions stored in the ROM. As discussed, this REM data can be patch or update to the firmware or microcode executed by the ROM 138. The REM data can further be or include REM code that is debug firmware or a test mode program that provides testing abilities. In one embodiment, the REM-profiled page can further include multiple REM-profiled pages corresponding to a set of different REM data or REM code.

If the flag is not set, at operation 440, the processing logic executes a read page command to read OTP data (or code) from an OTP-profiled page of the set of reserved pages. At operation 450, the processing logic loads production REM data from the OTP-profiled page into a latches buffer to be executed as a modification to operation of the instructions stored in the ROM.

Advantages of the present disclosure include but are not limited to making possible firmware updates to the ROM of the memory device. This enables sending REM data to update the ROM firmware via customer mode commands or remotely by a vendor server. As discussed with reference to FIG. 2, this is helpful for post qualification test issues that can only be fixed via REM data. The advantages further include allowing in-field debugging, e.g., diagnosis of failures of the memory device. During memory device failures, the vendor can execute diagnostic tests and sequences through these REMs to triage a reason for the failure. The REMs can also be written (e.g., to one of the registers 160) to output a health report that can be shared with customers. The vendor can use health report to root cause the issue. Furthermore, faster root causing is made possible because customer can execute the test via the existing set feature command.

Advantages of the present include further include but are not limited to allowing system teams the ability to load and execute test modes of the memory device. This ability provides internal system teams with the ability to execute tests and diagnose health of the memory device 130. Accordingly, defects and failures can be detected earlier and prevented from happening, resulting in fewer customer failures. The advantages can further include optionally providing access to certain test modes (and their results) by customers without the customers having access to the REM data itself. Because invention uses existing OTP operation mode features, the REM data (or REM code) can be loaded via the REM profile mode and executed. The REM data/code can be restricted to be written to only output status data to the page buffers that customers can read out or to status registers can be updated. This can be useful for specialized customers that want to do targeted testing to rule out defects. But at the same time, the vendor can protect the REM-related data and code by not disclosing test sequences.

Figure 5:
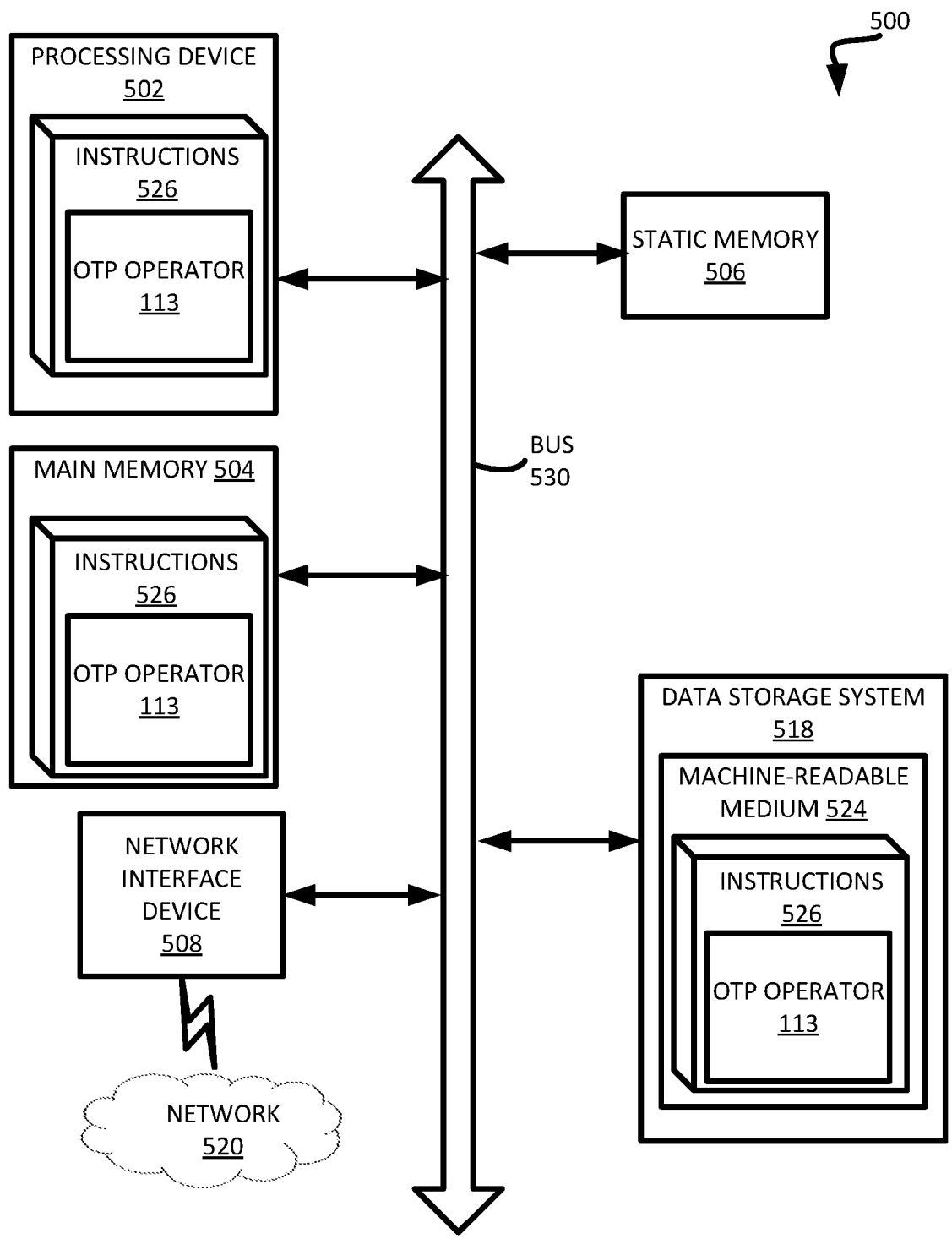
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIGS. 1A-1B) that includes, is coupled to, or utilizes a memory sub-system (e.g., the memory sub-system 110 of FIGS. 1A-1B) or can be used to perform the operations of a controller 115 (e.g., to execute instructions of the OTP operator 113 of FIG. 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIGS. 1A-1B.

In one embodiment, the instructions 526 include instructions to implement functionality corresponding to an error determining component (e.g., the OTP operator 113 of FIG. 1B). While the machine-readable storage medium 524 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A programmable memory device comprising:
a read only memory (ROM) block to store instructions associated with functionality of the programmable memory device;
a memory array comprising a set of reserved pages to store updates to be performed on the ROM block, wherein the set of reserved pages are one time programmable (OTP) pages; and
a controller coupled to the ROM block and the memory array, wherein the controller is to perform operations comprising:
executing a set features command to access the set of reserved pages;
programming a set of sub-feature parameters to a specified feature address of the set of reserved pages, wherein the set of sub-feature parameters are to trigger operation within a ROM-emulated memory (REM) profile mode, the specified feature address is different than an address for execution within an OTP operation mode, and wherein the REM profile mode is an extension to operation of the OTP operation mode; and
programming a REM-profiled page of the set of reserved pages with REM data received from a host system.

2. The programmable memory device of claim 1, wherein the REM-profiled page further comprises multiple REM-profiled pages corresponding to a set of different REM data.

3. The programmable memory device of claim 1, wherein to executing the set features command and programming the set of sub-feature parameters to the specified feature address of the set of reserved pages, the controller is to perform operations in response to user inputs received from the host system, and wherein the REM profile mode is a user-selectable REM profile mode.

4. The programmable memory device of claim 1, wherein the controller is further to set a flag stored in one of a reserved page or the REM-profiled page, the flag to indicate whether the REM data is stored in the REM-profiled page.

5. The programmable memory device of claim 4, wherein the controller is further to, upon power up of the programmable memory device:
detect that the flag is set; and
load the REM data from the REM-profiled page into a latches buffer to be executed as a modification to operation of the instructions stored in the ROM.

6. The programmable memory device of claim 5, further comprising static random access memory (SRAM) coupled to the controller, wherein the latches buffer is located within the SRAM, and the controller is further to execute the instructions to redirect a state machine of the ROM to an identified address within the latches buffer.

7. The programmable memory device of claim 4, wherein the controller is further to, upon power up of the programmable memory device:
detect that the flag is not set; and
load production REM data from the set of reserved pages into a latches buffer to be executed as a modification to operation of the instructions stored in the ROM.

8. A programmable memory device comprising:
a read only memory (ROM) block to store instructions associated with functionality of the programmable memory device;
a memory array comprising a set of reserved pages to store updates to be performed on the ROM block, wherein a first reserved page of the set of reserved pages is to store a flag; and
a controller coupled to the ROM block and the memory array, wherein upon power up of the programmable memory device, the controller is to execute the instructions to:
detect that the flag is set within the first reserved page, the flag to indicate that ROM-emulated memory (REM) data stored in the set of reserved pages is associated with a REM profile mode;
execute a page read command to read the REM data from a REM-profiled page of the set of reserved pages; and
load the REM data from the REM-profiled page stored in the set of reserved pages into a latches buffer to be executed as a modification to operation of the instructions stored in the ROM.

9. The programmable memory device of claim 8, wherein the reserved pages are one time programmable (OTP) pages and wherein the REM-profiled page comprises multiple REM-profiled pages corresponding to a set of different REM data.

10. The programmable memory device of claim 8, wherein the controller is further to:
execute a set features command to access the set of reserved pages;
program a set of sub-feature parameters to a specified feature address of the set of reserved pages, wherein the set of sub-feature parameters are to trigger operation within the REM profile mode;
program the REM-profiled page with the REM data received from a host system; and
set the flag within the first reserved page.

11. The programmable memory device of claim 8, wherein the REM data includes REM code, and wherein the controller is further to execute the REM code out of the REM-profiled page to perform a diagnostic test on the programmable memory device.

12. The programmable memory device of claim 11, wherein, as part of performance of the diagnostic test, the controller is further to output status data to one of page buffers or a status register of the programmable memory device.

13. The programmable memory device of claim 8, further comprising registers coupled to the controller, wherein the latches buffer is located within a register of the coupled registers.

14. A method comprising:
operating a programmable memory device comprising a read only memory (ROM) block to store instructions associated with functionality of the programmable memory device, a memory array including a set of reserved pages to store updates to be performed on the ROM block, wherein the set of reserved pages are one time programmable (OTP) pages, and a controller, and wherein operating the programmable memory device comprises:
executing, by the controller, a set features command to access the set of reserved pages;
writing, by the controller, a set of sub-feature parameters to a specified feature address of the set of reserved pages, wherein the set of sub-feature parameters are to trigger operation within a ROM-emulated memory (REM) profile mode, the specified feature address is different than an address for execution within an OTP operation mode, and wherein the REM profile mode is an extension to operation of the OTP operation mode; and
programming, by the controller, a REM-profiled page of the set of reserved pages with one of REM data or REM code received from a host system.

15. The method of claim 14, wherein programming the REM-profiled page further comprises programming each of multiple REM-profiled pages, of the set of reserved pages, corresponding to respective ones of a set of different REM data or REM code.

16. The method of claim 14, wherein the executing and the writing are performed in response to receiving user inputs from the host system, and wherein the REM profile mode is a user-selectable REM profile mode.

17. The method of claim 14, wherein operating the programmable memory device further comprises setting a flag associated with the REM data or REM code to indicate whether the REM data or REM code is stored in the REM-profiled page.

18. The method of claim 17, wherein, upon power up of the programmable memory device, operating the programmable memory device further comprises:
detecting that the flag is set; and
loading the REM data or REM code from the REM-profiled page into a latches buffer to be executed as a modification to operation of the instructions stored in the ROM.

19. The method of claim 17, wherein, upon power up of the programmable memory device, operating the programmable memory device further comprises:
detecting that the flag is not set; and
loading production REM data from the set of reserved pages into a latches buffer to be executed as a modification to operation of the instructions stored in the ROM.

20. The method of claim 14, wherein operating the programmable memory device further comprises executing the REM code to:
perform a diagnostic test on the programmable memory device; and
output status data to one of a page buffer or a status register of the programmable memory device.

21. The programmable memory device of claim 1, wherein the controller is to perform the operations in response to receipt of a remote command via a host system.

* * * * *